Figure 1:
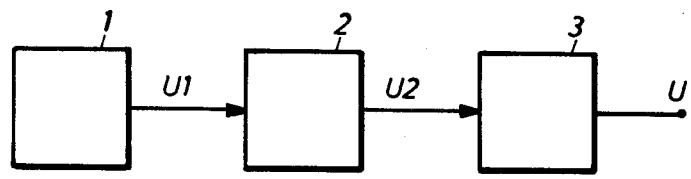

United States Patent [19]
Bergman

[11] 4,140,981
[45] Feb. 20, 1979

[54] LINEARIZING NETWORK

[75] Inventor: Tage Å. S. Bergman, Molndal, Sweden

[73] Assignee: Telefonaktiebolaget L M Ericsson, Stockholm, Sweden

[21] Appl. No.: 879,736

[22] Filed: Feb. 21, 1978

[30] Foreign Application Priority Data

Mar. 3, 1977 [SE] Sweden .............................. 7702344

[51] Int. Cl.$^2$ .............................................. H03C 3/22
[52] U.S. Cl. .................................... 332/18; 307/229; 331/177 V; 328/142
[58] Field of Search ............ 332/18, 30 V; 331/36 C, 331/177 V; 328/142, 184; 307/229, 230

[56] References Cited
U.S. PATENT DOCUMENTS

| | | | |
|---|---|---|---|
| 3,519,954 | 7/1970 | Parkyn | 331/177 V |
| 3,617,947 | 11/1971 | Jensen | 332/18 |
| 3,986,048 | 10/1976 | Okada et al. | 307/229 |
| 4,015,079 | 3/1977 | Satou | 307/230 |

Primary Examiner—John Kominski
Attorney, Agent, or Firm—Hane, Roberts, Spiecens & Cohen

[57] ABSTRACT

A linearizing circuit is described which gives a nonlinear relation between an input and an output signal of the circuit. Such a circuit can be used to compensate for the nonlinearity in, for example, a frequency modulator. The circuit includes a nonlinear element, preferably a PIN-diode connected in a voltage divider to provide a biasing current to the element. An attenuating and an amplifying circuit are connected to the input and to the output, respectively, of the circuit. By varying the values of the attenuation/amplification and the value of the operation point of the element, the nonlinearity of the circuit can be varied.

4 Claims, 2 Drawing Figures

LINEARIZING NETWORK

The present invention relates to a linearizing circuit which gives a non-linear relation between an input signal and an output signal in which relation the linear component can be varied. More specific, the invention relates to a linearizing circuit which is connected between a modulating signal source and a frequency modulator in order to compensate the nonlinearity of the modulator.

At, for example, radio link transmission, direct modulation is used, i. e. modulation of the high frequency carrier is carried out directly with the signal which is to be transmitted. Due to the high demands regarding the frequency stability of the transmitted modulated signal, difficulties arise to carry out the modulation with sufficient linearity, i. e. a linear relation between the modulating signal and the frequency change of the signal transmitted. At direct modulation, it is previously known to compensate the nonlinearity at the modulation by letting the modulating signal pass a linearizing network which, before modulation, introduces such a nonlinearity of the signal that compensation for the nonlinearity in the modulator is obtained. By, for example, the U.S. Pat. No. 3,617,947 a linearizing network for this purpose is previously known in which diodes are successively connected in dependence on the increase of the voltage across the same in order to approximate an arbitrary nonlinearity by suitable choice of the number of diodes and the breaking points of the same. Thus, in the known circuit, a number of diodes are connected at different voltage levels which implies a component consuming circuit.

The object of the present invention is to provide a linearizing circuit, preferably for a frequency modulator, by means of which a nonlinear relation between the input and output signal is obtained and in which relation the linear component can be varied without essential change in the signal-to-amplitude proportion. The proposed circuit has the advantage that it includes only one nonlinear element.

Figure 2:
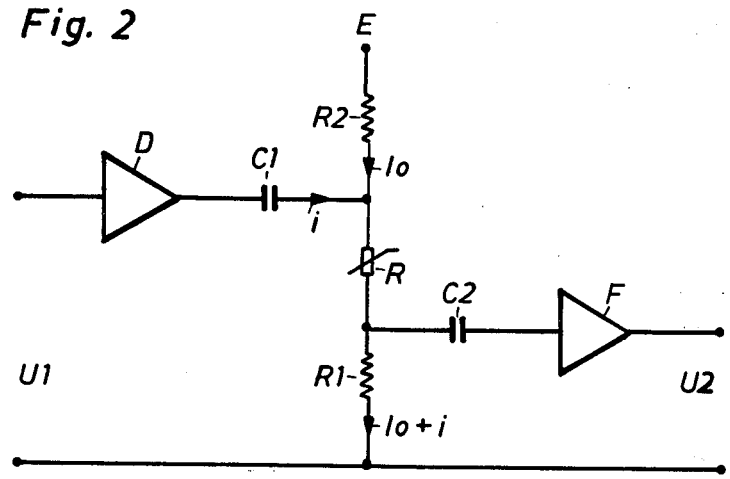

The invention, the characteristics of which appear from the appended claims will now be described with reference to the accompanying drawing in which FIG. 1 shows a simplified block diagram which illustrates the connection of the inventive circuit between a signal source and a frequency modulator, FIG. 2 shows a circuit diagram of the circuit according to the present invention.

In the block diagram according to FIG. 1, a signal source is designated 1 and consists of, for example, a generator for TV- or telephone signals. The signal source 1 is connected to the linearizing circuit according to the present invention which in turn is connected to a control input of a frequency modulator 3, the frequency modulated signal being obtained across its output. The output signals obtained from the blocks 1, 2, and 3 are designated by U1, U2, and U, respectively. The modulator 3 consists, for example, of an oscillator containing a resonance circuit in which a voltage controlled capacitor diode, a so called varactor diode, is included, the frequency modulation of the modulating signal U2 being carried out by variation of the varactor diode capacitance. Since the voltage-to-capacitance relation of the varactor diode is nonlinear, there is a non-linearity in the relation between the modulating signal and the frequency deviation. By connecting the linearizing circuit 2 between the signal source 1 and the modulator 3, the nonlinearity of the modulator can be compensated. The linearizing circuit 2 gives a nonlinear relation between the input signal U1 and the output signal U2 which can be expressed as:

$$U2 = k1 \cdot U1 + k2 \cdot U1^2 + k3 \cdot U1^3 +$$

The nonlinearity of this relation is obtained from $$(dU2/dU1) = k1 + 2k2 \cdot U1 + 3k3 \cdot U1^2 +$$

where the coefficient k1 indicates the nominal gain of the circuit and the factors $2k2 \cdot U1$, $3k3 \cdot U1^2$ indicate a nonlinearity of the circuit the factors of which vary linearly and quadratically, respectively with U1. By varying the linear component, i. e. the coefficient $k2$, the corresponding component in the non-linear modulation characteristic of the modulator 3 can be compensated.

The circuit according to FIG. 2 contains on the input side an attenuator D the input of which forms the input of the circuit and across which the signal U2 (cf. FIG. 1) appears. The attenuator D is via the capacitor C connected to a connection point of the voltage divider which consists of two linear resistors R1, R2 and a nonlinear element R. The voltage divider R1, R2, R is connected to a constant supply voltage E, a DC-current Io flowing through the voltage divider. The output side of the circuit contains an amplifier F the input of which via a second capacitor C2 is connected to the other connection point of the voltage divider. In the embodiment according to FIG. 2, the output of the attenuator D and the input of the amplifier F are via the respective capacitor connected to each side of the nonlinear element R. The capacitors C1, C2 are connected to prevent the DC-current Io to flow through the attenuator D and the amplifier F. The output signal U2 of the circuit is obtained across the output of the amplifier F. The attenuation of the attenuator D is preferably chosen equal to the inverted value of the amplification of the amplifier F.

The resistance of the non-linear element R can be written as $R = k \cdot I^x$, where $k$ and $x$ are constants and $x \leq (x \neq 1)$, the total current through the element R being $I = Io + i$. This element consists suitably of a so called PIN-diode, i. e. a diode the dynamic resistance of which varies between certain values by varying the bias current Io (see, for example, Hewlett Packard Specification PIN Diodes type 3001–3201, 1966). The DC-current determines the operation point of the circuit so that the PIN-diode obtains a certain resistance value Ro. When the modulating signal appears across the input of the circuit, the resistance R of the PIN-diode varies as a function of the current I, the resistance $R = (k/I)$ for $x = -1$.

In order to determine the output signal U2 as a function of the incoming modulating signal U1, the capacitors C1, C2 are assumed to have a negligible impedance at the frequency of the modulating signal. The following relations can then be written:

$$i = \frac{U1}{G(R + R1)} \quad (1)$$

$$R = \frac{k}{Io + i} \quad (2)$$

$$U2 = i \cdot R1 \cdot G, \quad (3),$$

where G = the gain of the amplifier F under the assumption that the attenuation of the attenuator D is = 1/G. This gives:

$$U2 = \frac{1}{2} ( \sqrt{Io^2 R1^2 G^2 + k^2 G^2 + U1^2 + 2IoRIG^2 k + 2U1IoRIG - 2U1kG} - 2IoRIG - kG + U1 \quad (4)$$

The expression (4) gives a relation between the output signal U2 and the input signal U1. From the expression for U2 as a function of U1, it appears that the relation is nonlinear. Of interest is to clculate the nonlinearity in this relation. This can be done by forming (dU2/dU1), thus $$\frac{dU2}{dU1} = \frac{1}{2} \left( \frac{U1 + IoRIG - kG}{\sqrt{Io^2 R1^2 G^2 + k^2 G^2 + U1^2 + 2IoRIG^2 k + 2U1IoRIG - 2U1kG}} + 1 \right)$$

The linear component in the nonlinear relation is obtained $$\frac{d^2 U2}{dU1^2}.$$

$$\frac{d^2 U2}{dU1^2} = \frac{2G^2 kIoRI}{(Io^2 R1^2 G^2 + k^2 G^2 + U1^2 + 2IoRIG^2 k + 2U1IoRIG - 2U1kG)^{\frac{3}{2}}}$$

For a practical case the following is valid
$$Io \cdot R1 >> k$$
$$Io \cdot R2 >> U1 \quad (5)$$

This gives $\frac{d^2 U2}{dU1^2} \approx \frac{2k}{GIo^2 R1^2}$.

From this relation it appears that the linear component in the nonlinear relation between U2 and U1 can be varied by varying G, Io, or R1. The variation can be carried out in positive or negative direction by choosing a positive or a negative amplification factor G of the amplifier F.

In order to investigate what influence a change in the linear component in the relation (4) has regarding the total gain of the circuit, the assumption according to the relation (5) is used which gives $$\frac{U2}{U1} = 1 - \frac{k}{IoR1 + k + U1/G} \approx 1 \quad (6)$$

From this expression and from the assumption (5) it is realized that the linearity of the output signal U2 can be varied by variation of Io, R1 or G without any essential change in the circuit gain. From relation (6) it also appears that this is valid with special great accuracy when the factor G is varied.

The circuit according to the invention thus enables that a modulating signal which is supplied to a frequency modulator can be changed regarding its linear component without any significant change in the amplitude of the signal. With a knowledge of the nonlinearity of the modulator, thus, a compensating nonlinearity in the modulating signal can be adjusted by means of the circuit according to the invention, whereby the influence of the non-linear properties of the modulator essentially can be cancelled.

The inventive circuit is for its usefulness not limited to a frequency modulator, but can also be used at other circuits in order to compensate an undesirable nonlinearity.

We claim:
1. Linearizing circuit which gives a nonlinear relation between an incoming and an outgoing signal, preferably for compensation of the nonlinearity of a frequency modulator, comprising
   (a) an attenuator the input of which forms the input of the circuit,
   (b) a voltage divider connected to a supply voltage source, said voltage divider containing a nonlinear element having a resistance $R = k \cdot I^x$, where I = the current through the element and the factors k, x are constants, specific for the element,
   (c) an amplifier whose output forms the output of the circuit, the output of the attenuator and the input of the amplifier being connected to each terminal of the nonlinear element.
2. A circuit as claimed in claim 1, wherein the attenuation of the attenuator is equal to the inverted value of the amplification of the amplifier.
3. A circuit as claimed in claim 1, wherein said nonlinear element consists of a PIN-diode.
4. a circuit as claimed in claim 3, wherein the resistance of the PIN-diode fulfills the condition R = k/I.

* * * * *